United States Patent
Ellis et al.

(10) Patent No.: US 7,215,221 B1
(45) Date of Patent: May 8, 2007

(54) HARMONIC TERMINATION CIRCUIT FOR MEDIUM BANDWIDTH MICROWAVE POWER AMPLIFIERS

(75) Inventors: Grant Andrew Ellis, Los Angeles, CA (US); Jeong-Sun Moon, Moorpark, CA (US); Ara K. Kurdoghlian, La Crescenta, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/929,619

(22) Filed: Aug. 30, 2004

(51) Int. Cl.
*H01P 5/12* (2006.01)
(52) U.S. Cl. ................................ 333/125; 330/302
(58) Field of Classification Search ........... 330/302, 330/295, 124 R; 333/101, 104, 125, 127
See application file for complete search history.

(56) References Cited

U.S. PATENT DOCUMENTS

| | | | |
|---|---|---|---|
| 4,435,688 A | | 3/1984 | Shinkawa et al. |
| 5,095,285 A | * | 3/1992 | Khatibzadeh ............... 330/306 |
| 5,276,406 A | * | 1/1994 | Samay et al. ............... 330/277 |
| 5,300,895 A | * | 4/1994 | Jones .......................... 330/251 |
| 5,329,249 A | * | 7/1994 | Cripps ......................... 330/302 |
| 5,969,575 A | * | 10/1999 | Helms ......................... 330/294 |
| 6,023,611 A | * | 2/2000 | Bolin et al. ............... 455/114.1 |
| 6,236,274 B1 | * | 5/2001 | Liu ............................. 330/302 |
| 6,346,859 B1 | * | 2/2002 | Saitou ......................... 330/286 |
| 6,587,018 B1 | * | 7/2003 | Meck et al. ................. 333/175 |
| 6,653,917 B2 | * | 11/2003 | Kang et al. ............... 333/99 S |
| 6,700,444 B2 | * | 3/2004 | Pengelly ...................... 330/295 |
| 6,844,793 B2 | * | 1/2005 | Kenington ................... 333/101 |
| 2005/0083723 A1 | * | 4/2005 | Blednov et al. ............ 365/154 |
| 2005/0110576 A1 | * | 5/2005 | Rhodes ........................ 330/305 |

* cited by examiner

*Primary Examiner*—Benny T. Lee
*Assistant Examiner*—Kimberly E Glenn
(74) *Attorney, Agent, or Firm*—Christie, Parker & Hale, LLP.

(57) ABSTRACT

A compact amplifier output bias circuit is used as a broadband harmonic termination. The bias circuit is adapted as a harmonic termination circuit to produce an effective low impedance or act as a load at the signal harmonic frequencies while having the capability of supplying DC power to the amplifier stage, optionally, if needed. A pi network is coupled to an active device output and provides a low impedance at frequency bands above a frequency band of operation while allowing DC bias to be appliable to the active device output.

4 Claims, 11 Drawing Sheets

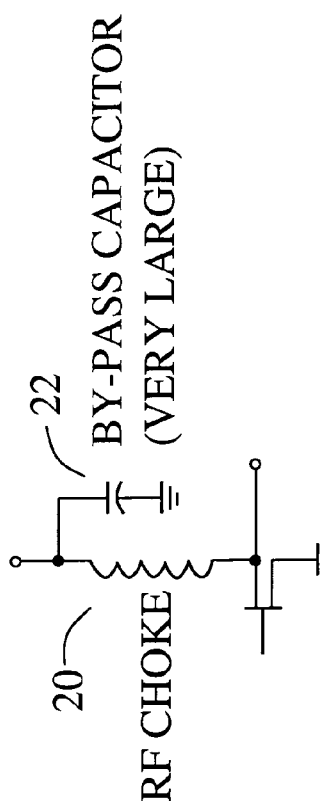
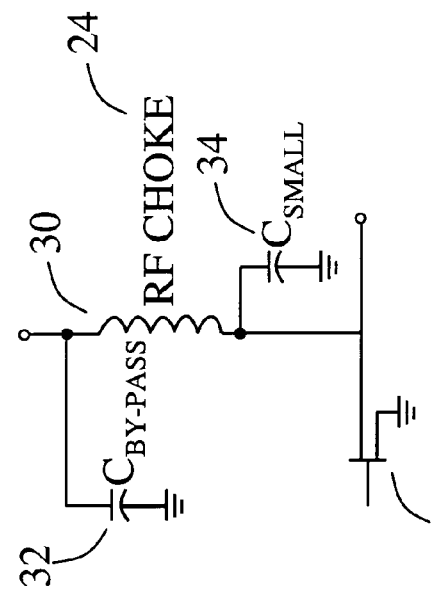

HARMONIC TERMINATION CIRCUIT FOR MEDIUM BANDWIDTH MICROWAVE POWER AMPLIFIERS

STATEMENT REGARDING FEDERALLY SPONSORED RESEARCH OR DEVELOPMENT

This invention was made with U.S. Government support under Contract No. N00014-03-C-0241 awarded by the Office of Naval Research. The U.S. Government has certain rights to this invention.

BACKGROUND OF THE INVENTION

This invention relates to the field of power amplifiers, and, more particularly, to microwave power amplifier harmonic frequency terminations.

Modern power amplifier architectures, such as balanced, push-pull, single ended and low noise power amplifiers, including microwave monolithic integrated circuit (MMIC) power amplifiers, have an increasing need for both linearity and power added efficiency.

Corporate feed networks, such as that shown in FIG. 1, are typically used to combine the outputs from many devices by terminating each device in the optimum load impedance for maximum power transfer. In corporate feed network 10 there are shown active device pairs 12a, 12b and 12c, 12d, and which may include other pairs as indicated by the dotted lines providing an even amount of active devices. The active devices, such as field effect transistors (FETS) or bi-polar junction transistors (BJTs), are fed by inputs 14a–14d. The sum of each of the active devices travel collectively through transmission lines, bends and tees 16 and are summed at common output terminal 18 to drive, for example, an antenna or transmission line.

Each of the active devices receive input signals over a frequency band spanning from a frequency range from $f_1$ to $f_2$, about a center frequency $f_o$. Because the active devices provide power amplification, harmonics such as $2f_o$, $3f_o$, etc. are generated. Such harmonics can be problematic for other networks operating adjacent to the network. For larger power amplifier circuits that utilize a significant amount of space for output power combining and which also tend to be somewhat broadband in performance, it is difficult to adequately provide harmonic terminations because so much area is required for power combining.

Prior art approaches for harmonic terminations are typically narrow band and are usually accomplished using an RF choke and a large bypass capacitor as a low-pass filter coupled to the drain or collector of the amplifier stage. FIG. 2 shows a typical prior art low pass filter, which passes DC but not any higher frequencies. Included are RF choke 20 and large by-pass capacitor 22 to stop RF while allowing DC to pass. At higher frequencies, a quarter-wave transformer and bypass capacitor are sometimes used to supply the DC bias. The approaches work quite well but are somewhat narrowband (less than 20%) and do not lend itself to medium bandwidth applications such as is typical with the corporate feed scheme.

A need therefore exists for a harmonic termination approach for modern power amplifiers which provides both linearity and power added efficiency without interfering with corporate power combining or feed distribution schemes. Embodiments in accordance with the present invention provide practical solutions to meet such need.

SUMMARY OF THE INVENTION

In accordance with the present invention a compact amplifier output bias circuit is used as a broadband harmonic termination. The bias circuit is adapted as a harmonic termination circuit to produce an effective low impedance (e.g., a short circuit) or act as a load at the signal harmonic frequencies ($2f_o$, $3f_o$) over a significantly greater bandwidth than in the prior art, in addition to having the capability of supplying DC power to the amplifier stage, optionally, if needed.

In one aspect of the present invention the broadband termination of amplifier harmonics from an active device includes configuring a pi network providing a low impedance at frequency bands above a frequency band of operation while allowing DC bias to be appliable to the active device output and coupling the pi network to the active device output.

In one embodiment the pi network may include a low pass filter coupled to an active device drain, the low pass filter having an RF choke and a first capacitor. A second capacitor is coupled in parallel with the low pass filter, the second capacitor being valued to resonate with the RF choke to produce a high impedance at a desired frequency and a low impedance to at least a second harmonic of the desired frequency.

In another embodiment the pi network may include a low pass filter coupled to an active device drain, the low pass filter having an RF choke and a first capacitor, and a series inductor capacitor resistor resonant circuit coupled in parallel with the low pass filter. The series inductor capacitor resistor resonant circuit has a resistor valued to provide a load to at least a second harmonic frequency of a desired frequency, a second capacitor being valued to resonate with the RF choke to produce a high impedance at the desired frequency and a low impedance to at least a second harmonic of the desired frequency, and an inductor being valued to resonate with the second capacitor at at least the second harmonic frequency of the desired frequency.

In another embodiment the pi network may be formed by a combination of lumped circuit elements and distributed transmission lines.

In another aspect of the present invention a power combiner is provided having broadband termination of amplifier harmonics. A power combining network has a plurality of input ports and a power combined output port. Respective amplifiers are coupled to the input ports, each amplifier having an active device output. A pi network is configured to provide a low impedance at frequency bands above a frequency band of operation while allowing DC bias to be appliable to the active device output, wherein a respective pi network is coupled to each active device output. The pi network may include a low pass filter coupled to an active device drain, the low pass filter having an RF choke and a first capacitor, and a second capacitor coupled in parallel with the low pass filter, the second capacitor being valued to resonate with the RF choke to produce a high impedance at a desired frequency and a low impedance to at least a second harmonic of the desired frequency. The pi network may alternatively include a low pass filter coupled to an active device drain, the low pass filter having an RF choke and a first capacitor, and a series inductor capacitor resistor resonant circuit coupled in parallel with the low pass filter. The series inductor capacitor resistor resonant circuit has a resistor valued to provide a load to at least a second harmonic frequency of a desired frequency, a second capacitor being valued to resonate with the RF choke to produce a high impedance at the desired frequency and a low impedance to at least a second harmonic of the desired frequency, and an inductor being valued to resonate with the second capacitor at at least the second harmonic frequency of the desired frequency. The pi network may be formed by a combination of lumped circuit elements and distributed transmission lines.

BRIEF DESCRIPTION OF THE DRAWINGS

FIG. 2 shows a conventional harmonic termination circuit.

FIG. 3 shows an exemplary embodiment of a harmonic termination circuit in accordance with the present invention.

DETAILED DESCRIPTION

Figure 1:
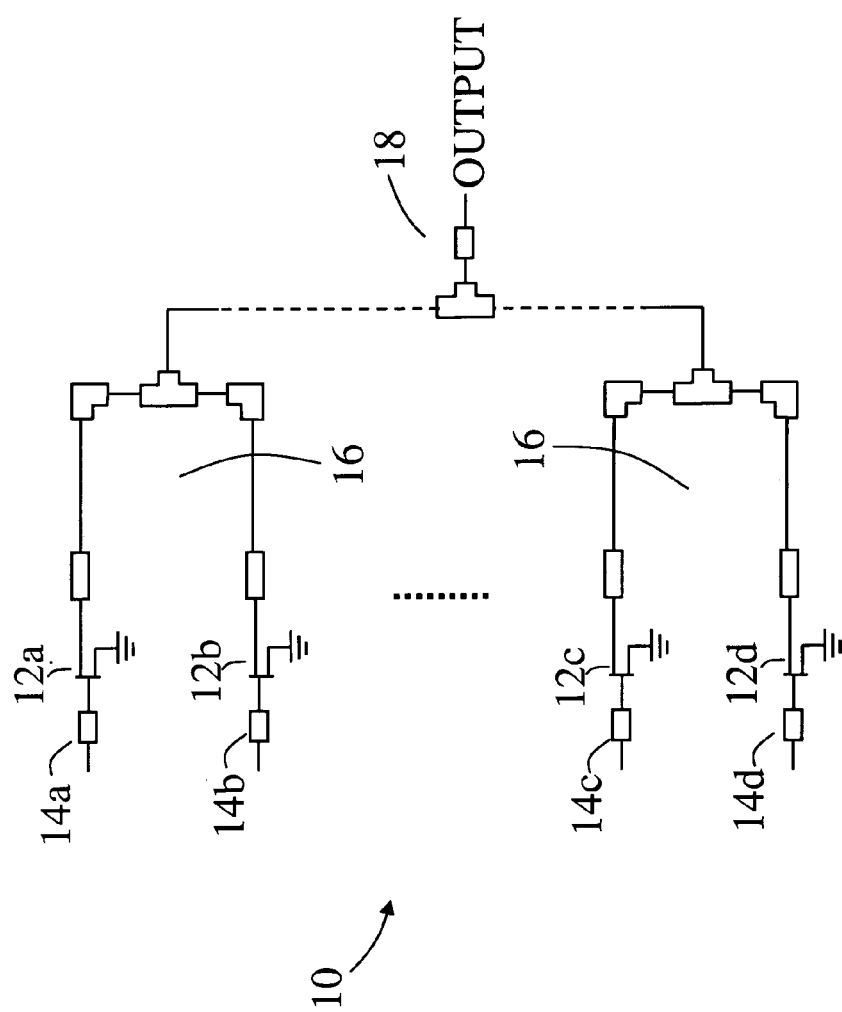
FIG. 1 shows a conventional corporate power combiner network.

Those skilled in the art can appreciate that it is desirable to operate a power amplifier in a nonlinear region where the amplifier gain is compressed to achieve maximum output power and efficiency. In compression, the drain current can be represented as: $I_d(t) = I_o + I_1 \cos(2\pi f_o t) + I_2 \cos(4\pi f_o t) + I_3 \cos(6\pi f_o t) + \ldots$ The components $I_2$, $I_3$ ... are the harmonic current amplitudes. $I_1$ is the fundamental frequency ($f_o$) current amplitude. $I_o$ is the DC bias current amplitude.

The present invention not only provides a compact amplifier output bias circuit but one that can be used as a broadband harmonic termination.

FIG. 3 shows an exemplary embodiment of harmonic termination circuit 24 in accordance with the present invention. The prior art low pass filter as shown in FIG. 2 is modified to a pi network to provide essentially a band pass response and to provide an effective low impedance (e.g., nearly a short circuit) at frequency bands above the frequency band of operation, including harmonics, while also allowing (optionally as desired) the filter to pass DC so that a particular amplifier stage (active device) can be biased if needed. In FIG. 3, as in the prior art RF choke 30 and by-pass capacitor 32 are provided similar to the filter circuit components depicted in FIG. 2. However, small capacitor 34 is added to resonate with RF choke 30 to produce a high impedance in the band around $f_o$ and a low impedance at its harmonic frequency $2f_o$.

In essence, harmonic termination circuit 24 coupled to active device 26 provides a reflection coefficient close to one and has an associated angle of about 0° at the operating center frequency ($f_o$), thereby providing an open circuit at $f_o$. Further, there is also a reflection coefficient close to one, but has an associated angle of about 180° at the harmonic frequencies ($2f_o$), thereby providing a low impedance (short circuit) at the harmonic frequency.

Figure 4:
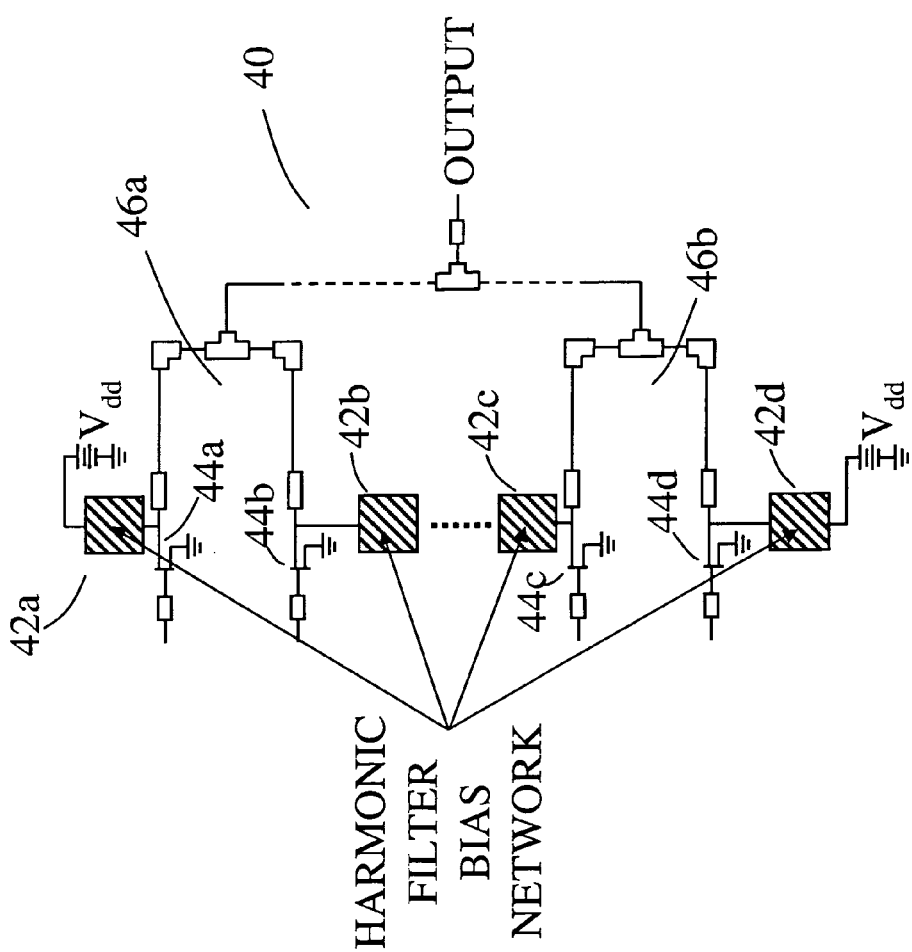
FIG. 4 shows an exemplary embodiment of a power combiner network implementing harmonic termination circuits in accordance with the present invention.

FIG. 4 shows an exemplary embodiment of the present invention for the harmonic termination circuit in a corporate power-combining network. Power combining network 40 has a plurality of harmonic termination circuits 42a–42d attached to each of the active devices 44a–44d. Of note is that some harmonic termination circuits 42a, 42d may be optionally coupled to bias voltage Vdd, while other harmonic termination circuits 42b, 42c are not coupled to the bias voltages Vdd. This occurs as a result of the DC capability of current flowing through the combining network sub-sections 46a, 46b and into bias harmonic termination circuits 42b, 42c respectively. As such, a direct bias voltage Vdd is not typically needed to be coupled to harmonic termination circuits 42b, 42c. Further, the harmonic termination circuits 42a, 42d with the direct bias voltage Vdd coupled thereto may have an additional RF choke between the bias source Vdd and the input to the harmonic filter bias network 42a, 42d to only allow DC to pass through. Accordingly, the harmonic termination circuit in accordance with the present invention can therefore be used as an individual harmonic termination for interior devices or cells without providing the DC biasing.

Figure 5:
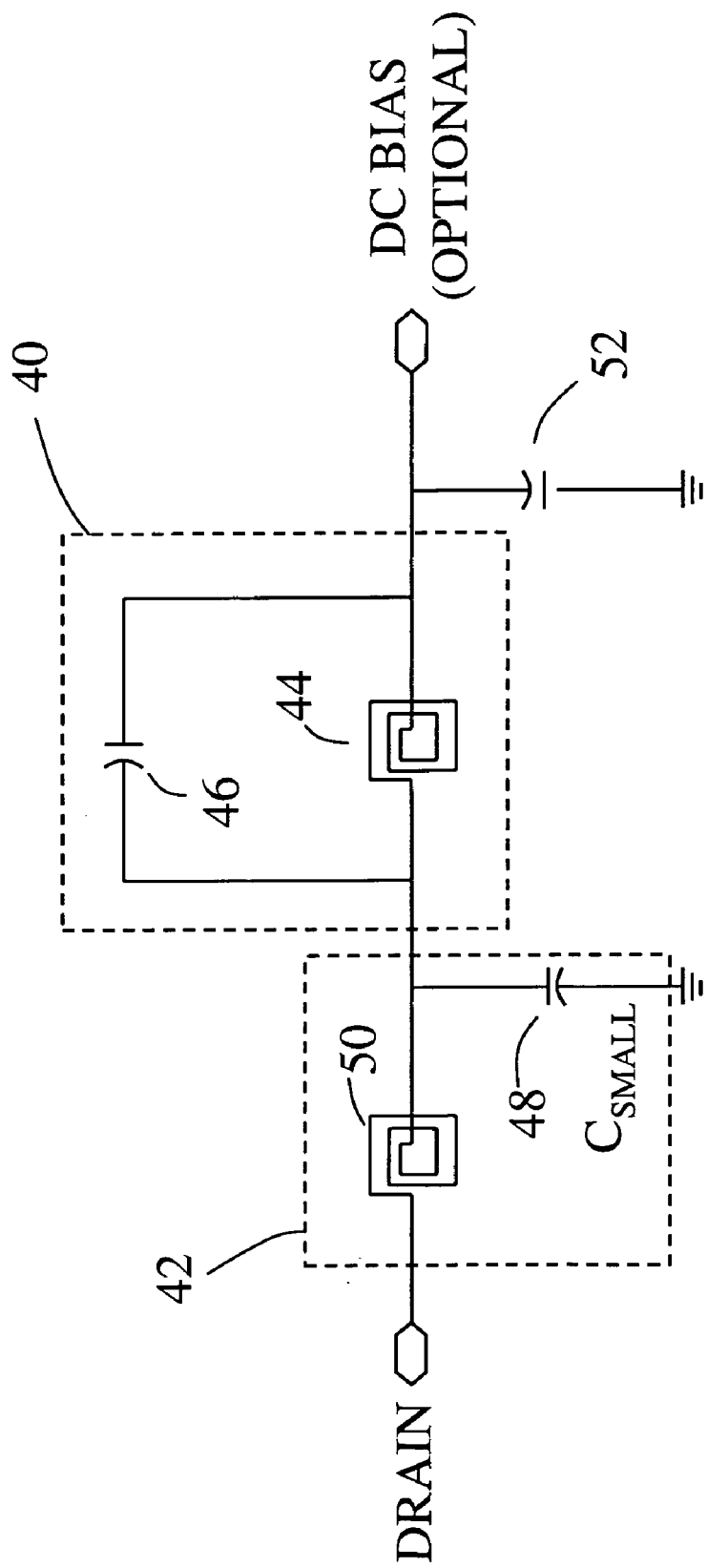
FIG. 5 shows an exemplary embodiment of a harmonic termination circuit in accordance with the present invention.

FIG. 5 shows a simulation schematic diagram of another exemplary embodiment of the harmonic termination circuit in accordance with the present invention. An expanded pi network is depicted with elements added to improve the frequency response.

Here, band-reject filter section 40 follows low-pass filter section 42. Band-reject filter section 40 includes RF choke 44 and by-pass capacitor 46. Low pass filter section 42 includes small capacitor 48 and inductor 50. Large capacitor 52 is involved with an optional DC bias.

Numerical simulations can be performed using the harmonic balance simulator in Agilent ADS which is a very accurate simulation tool and is believed to be representative of actual circuit performance. In the simulation embodiment of FIG. 5 the harmonic termination circuit is considered fabricated on a substrate such as silicon carbide, gallium arsenide, or indium phosphide.

In a first simulation inductor 44 would be in the range of 0.3–3 nH and be a square spiral inductor having 1.25 to 2.5 turns, 12 um line width, 142 μm lengths and 9.0 μm spacing. Inductor 50 would be in the range of 0.25–3 nH and also be square spiral inductor having 0.75 to 1.25 turns, 12 um line width, 121 um lengths and 9.0 μm conductor—conductor spacing. Capacitor 48 would be 0.39 pF.

In a second simulation inductor 44 would be in the range of 0.3–3 nH and be square spiral inductors having 0.75 to 1.25 turns, 12 μm line width, 152 μm lengths and 9.0 μm spacing. Inductor 50 would be in the range of 0.25–3 nH and also be a square spiral inductor having turns, 12 μm line width, 122 μm lengths and 9.0 μm conductor—conductor spacing. Capacitor 48 would be 0.42 pF.

For both the first and second simulations, capacitor 46 and capacitor 52 would be a large capacitance (>10 pF), such that at higher frequencies it would be a low impedance (almost a short circuit). Having capacitor 52 very large allows the residual RF to be put to ground for optional DC bias situations. While capacitor 46 usually does have a large value, it would be typically less than 1 pF for operation in the 6–9 GHz band. Also, the square spiral inductor could also be a circular spiral inductor.

Figure 6:
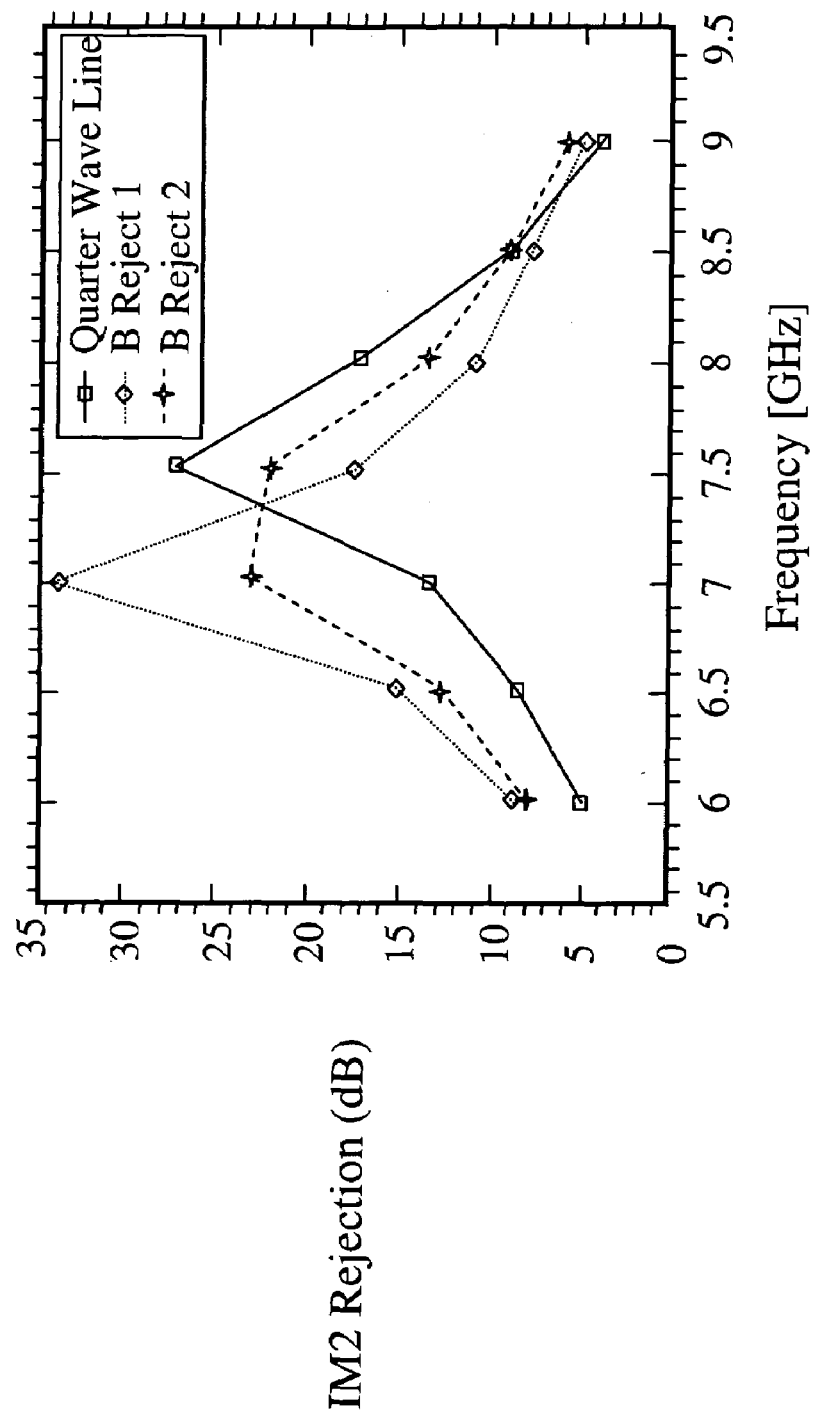
FIG. 6 graphically compares IM2 results when implementing exemplary embodiments of the present invention with that of a quarter wave line.

FIG. 6 shows the simulated $2^{nd}$ order intermodulation (IM2) rejection for a 4×75 μm aluminum gallium nitride (AlGaN) high electron mobility transistors (HEMTs) using the exemplary embodiment harmonic termination circuits shown in FIG. 5. In the simulation embodiments of FIG. 5, an open circuit at the fundamental frequency range e.g., $f_1-f_2$=6 to 9 GHz, is provided. Further, the termination circuit can provide a nearly short circuit at the second harmonic frequencies e.g., 12 to 18 GHz ($2f_o$). B Reject 1 depicts the first simulation embodiment. B Reject 2 depicts the second simulation embodiment. The simulated results using a conventional short circuited quarter wave (λ/4 at 7.5 GHz) transmission line are included for comparison. The improved performance using these exemplary embodiments of the filter is:

1. The harmonic termination circuit provides 29% more bandwidth than a quarter wave (λ/4) line for an improvement in IM2 rejection of more than 10 dB.

2. The harmonic termination circuit provides an average of 2 dB greater IM2 rejection than the quarter wave (λ/4) line without affecting the overall amplifier gain over the 6–9 GHz frequency band.

Because the harmonic filter consists of reactive tuning elements, those skilled in the art can appropriate tuning of the corporate feed network can eliminate any resulting in-band detuning or mismatch loss.

Figure 7:
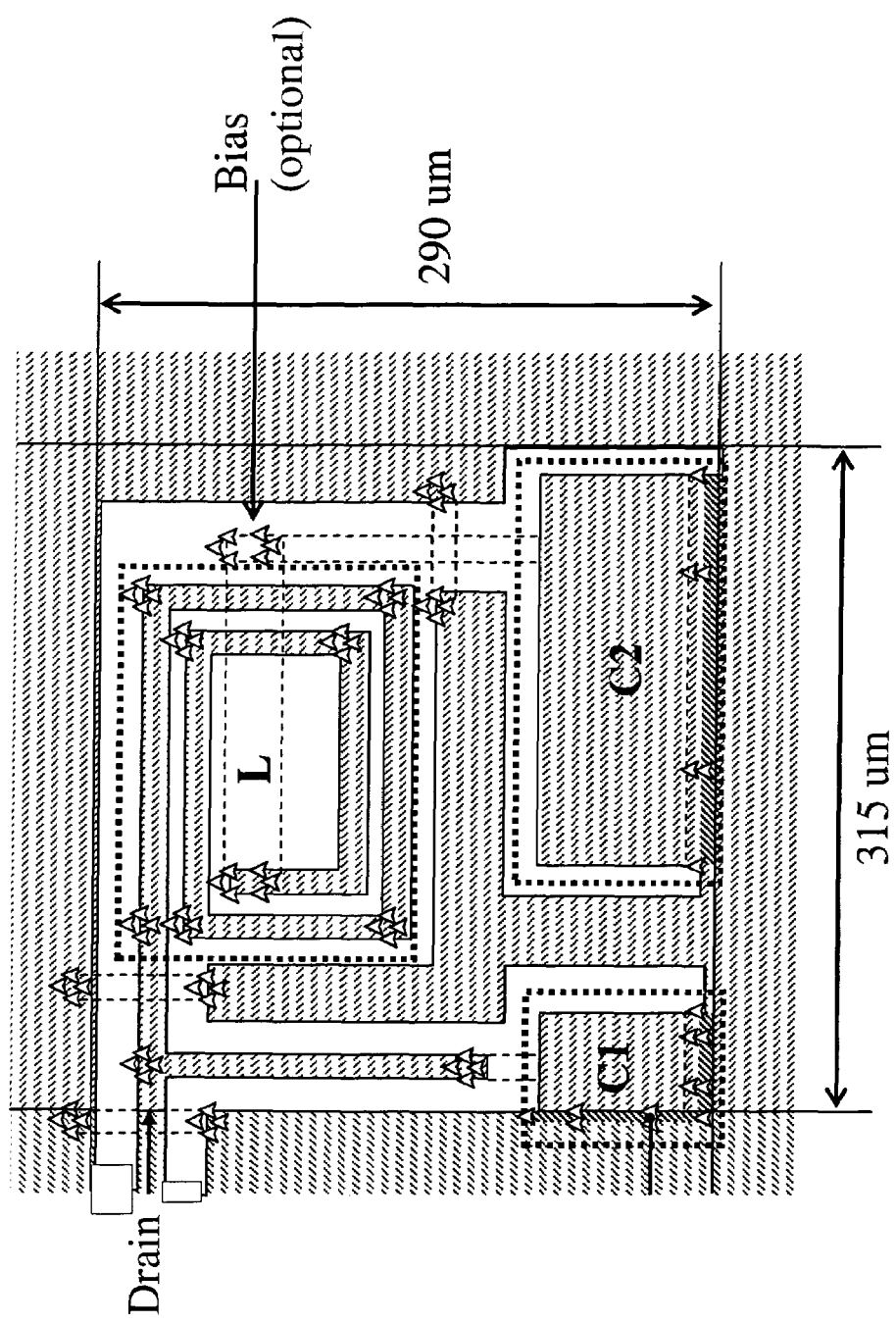
FIG. 7 shows another exemplary embodiment of a harmonic termination circuit in accordance with the present invention.

Referring now to FIG. 7, yet another exemplary embodiment of the harmonic bias filter network in accordance with the present invention is a MMIC pi network band pass structure and similar in component function as that depicted in FIG. 3, and consists of parallel small capacitance C1 (e.g., 1.2–1.4 pF) followed by series inductance L (e.g., 0.48–0.54 nH) followed by another parallel but large capacitance C2 (e.g., 4.4–5.4 pF). Inductors are usually not ideal and for this case would have the following additional parameters: Q=13–18 (f=7 GHz) and Rdc=1–2 Ohm.

FIG. 7 uses a Sonnet layout geometry to provide for a full wave electromagnetic simulation of planar passive microwave structures such as the harmonic termination filter in accordance with the present invention. A layered circuit such as those found in monolithic microwave integrated circuits (MMIC) and microwave integrated circuits (MIC) assumes a 5 μm metal thickness and a silicon carbide substrate.

Figure 8:
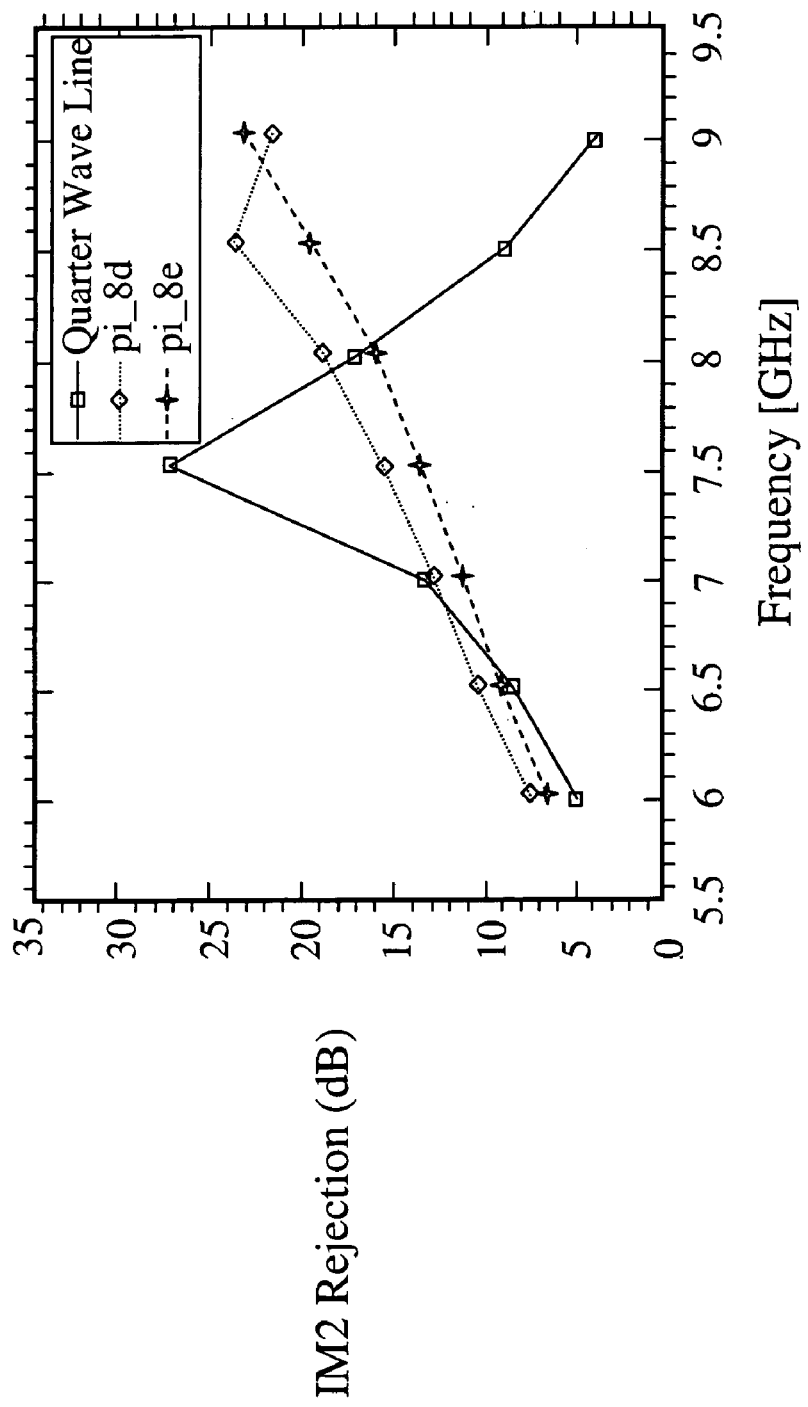
FIG. 8 graphically further compares IM2 results when implementing exemplary embodiments of the present invention with that of a quarter wave line.

FIG. 8, shows the simulated IM2 rejection using ADS for a 4×75 μm ALGaN/gallium nitride (GaN) HEMT pi network implementation of the harmonic termination circuit shown in FIG. 7, wherein the dimensional values are for pi__8d: C1: length=72 μm, width=63 μm; C2:length=72 μm, width=159 μm; L: length=129 μm, width=141 μm, n=2 turns; and for pi__8e: C1:length=72 μm, width=57 μm; C2: length=72 μm, width=168; L: length=129 μm, width=150 μm, n=2 turns. The quarter wave line results are again shown for comparison. The improved performance using this second exemplary embodiment of the filter is as follows:

1. the harmonic termination circuit provides 24–47% more bandwidth than a quarter wave (λ/4) line for improvement in IM2 rejection of 10 dB or more.

2. the harmonic termination circuit provides an average of about 3.7 dB greater IM2 rejection than the quarter wave (λ/4) filter without affecting the overall amplifier gain over the 6–9 GHz band.

While the first and second exemplary embodiments provide for a second harmonic short circuit terminations over a broad frequency range, for the case of a low noise amplifier or amplifiers where efficiency is not a major concern, further exemplary embodiments described hereinafter can include a resistive termination to the second harmonic over a broader frequency range than is presently available and without interfering with the corporate feed distribution scheme. In this way the resistive element can allow harmonic energy to be dissipated as heat.

Figure 9:
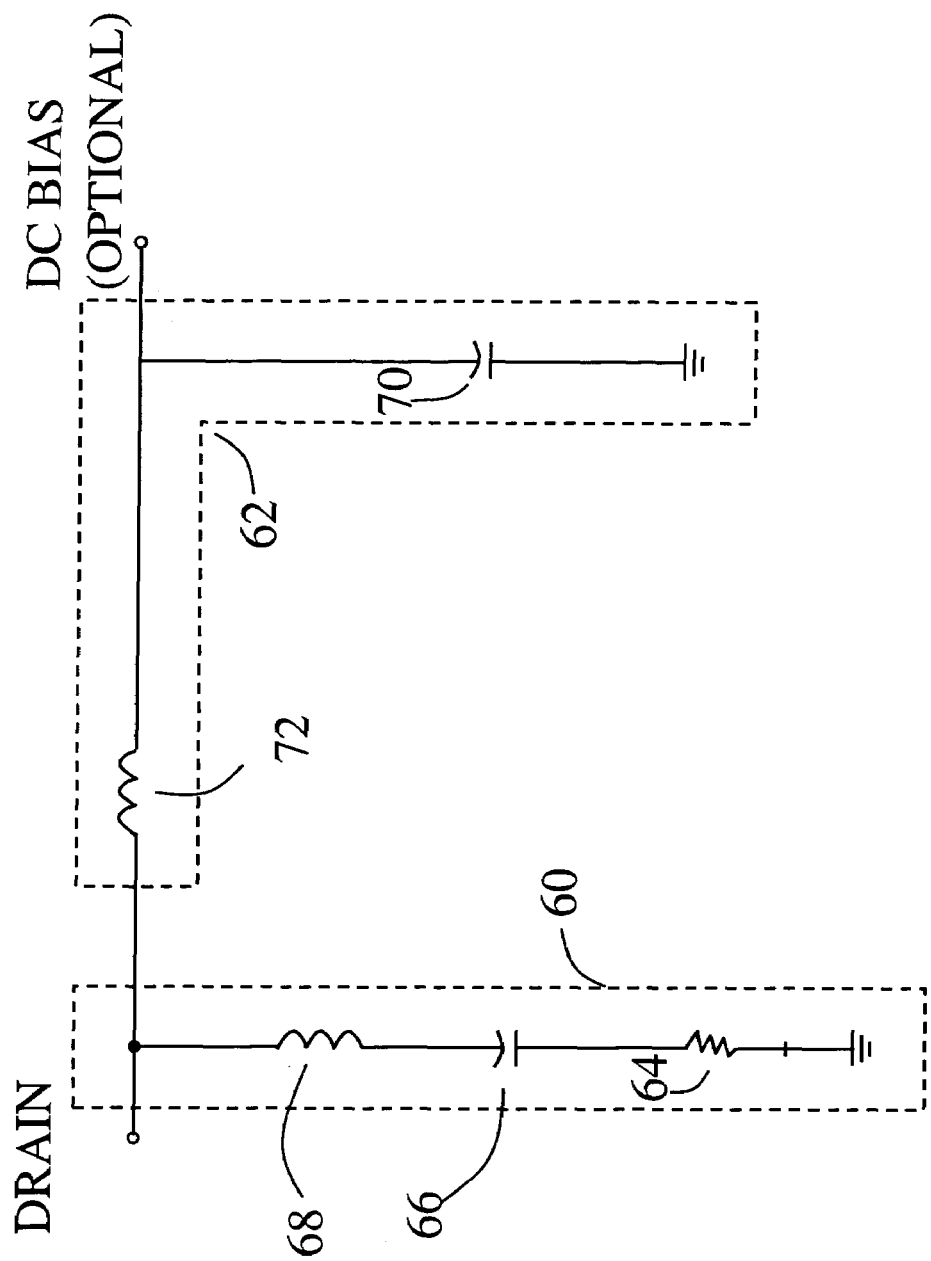
FIG. 9 shows yet another exemplary embodiment of a harmonic termination circuit in accordance with the present invention.

FIG. 9 shows a schematic diagram of another exemplary embodiment the harmonic termination circuit in accordance with the present invention. Here, series LCR resonant section 60 precedes low pass filter section 62. Series LCR resonant section 60 has capacitor 66 and inductor 68 to be resonant at $2f_o$. In this embodiment, fairly small resistor 64 (under 10 Ω) forms part of series LCR resonant circuit 60 and is used to provide a load to the second harmonic frequency range i.e., $2f_o$, and increase the bandwidth around $2f_o$. Low pass filter section 62 includes large capacitor 70 and inductor 72. Capacitor 66 and inductor 72 are valued to be nearly resonant at $f_o$. Representative element values for the harmonic termination network depicted in FIG. 9 are: resistor 64 is 2.55 Ω; capacitor 66 is 0.39 pF; inductor 68 is 0.16 nH; inductor 72 is 1.23 nH; capacitor 70 is 10 pF.

Figure 10:
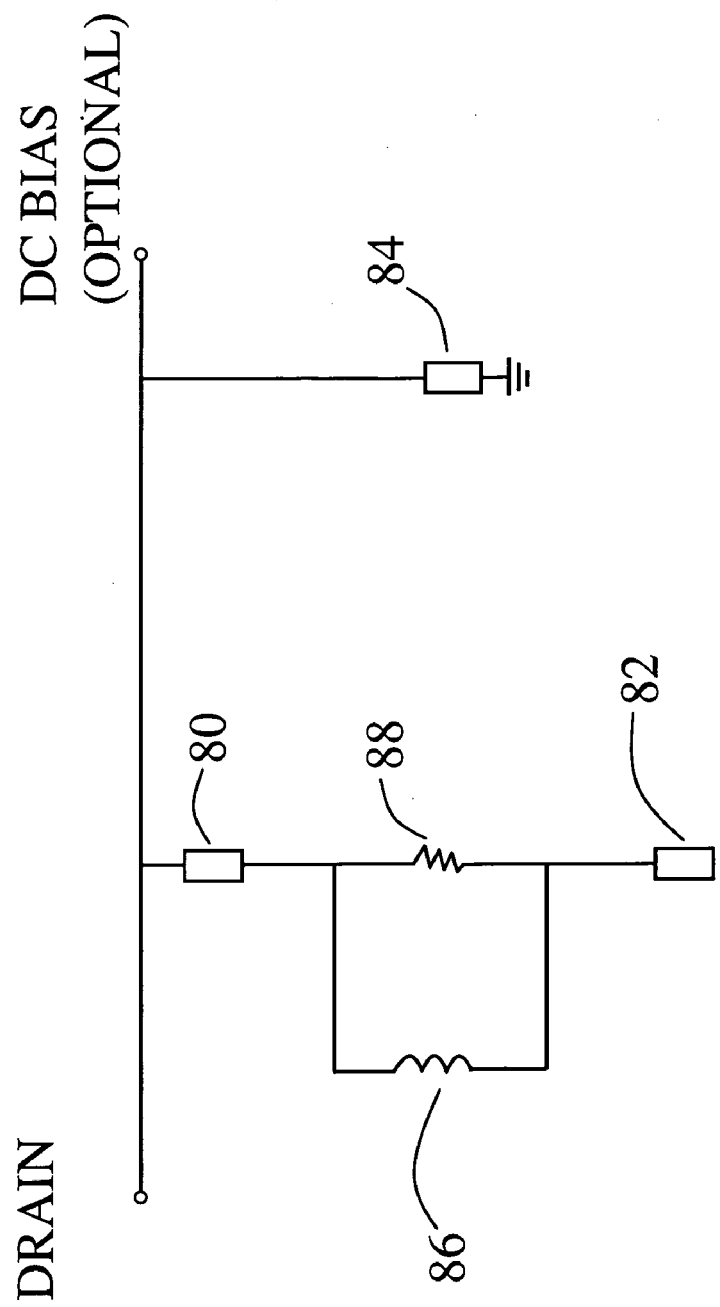
FIG. 10 shows still yet another exemplary embodiment of a harmonic termination circuit in accordance with the present invention.

The harmonic bias networks described in the above exemplary embodiments are representative of lumped filter realizations that can be used effectively through the X band frequency range. FIG. 10 shows a still further exemplary embodiment harmonic bias filter in accordance with the present invention using distributed or transmission line-like elements for use at higher frequencies where lumped elements do not work very well at all, such as above 20 GHz. Included are transmission lines 80, 82, 84, inductance 86 and resistance 88. Representative element values for the harmonic termination network depicted in FIG. 10 are: transmission line 80: length=1423 μm, width=170 μm; transmission line 82: length=196. μm, width=21 μm; transmission line 84: length=1238. μm, width–100 μm, inductance 86=3.65 nH; resistance 88=1335.Ω.

Figure 11:
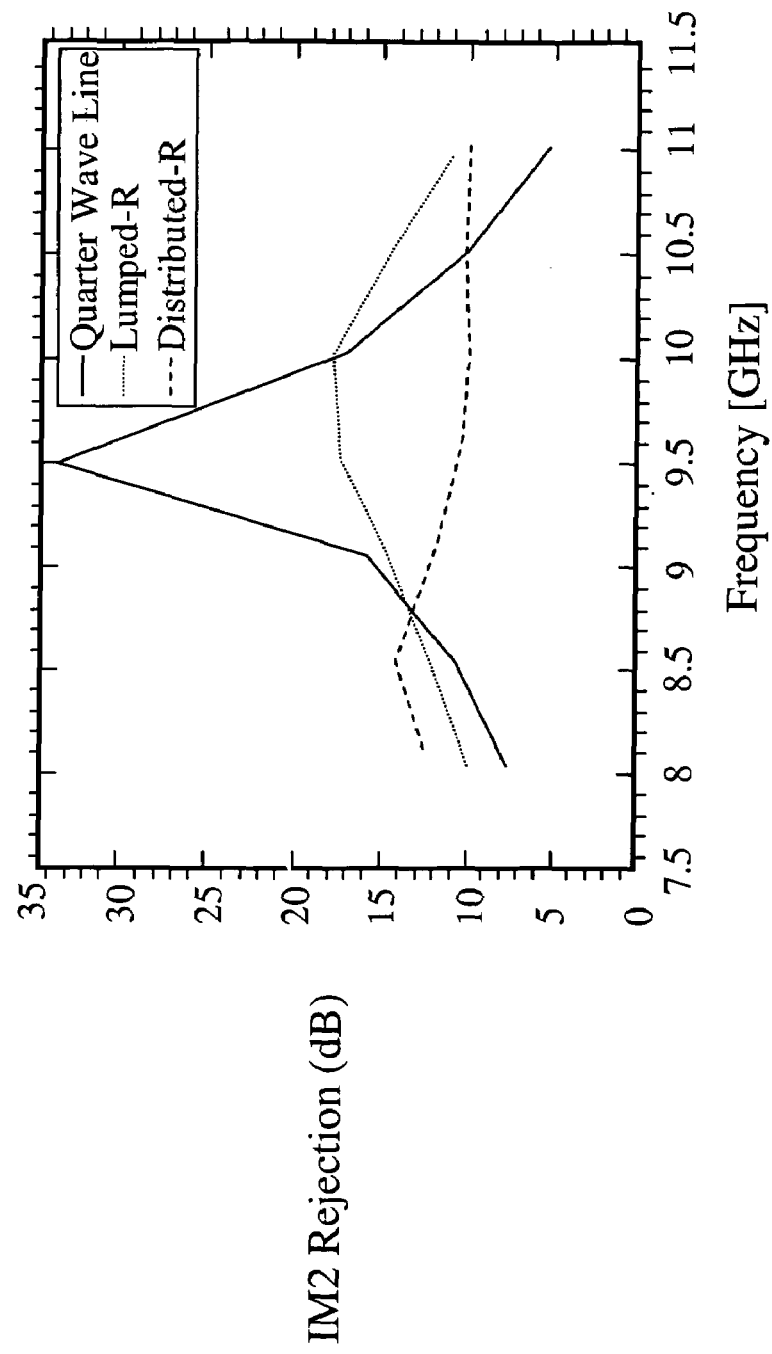
FIG. 11 graphically still further compares IM2 results when implementing exemplary embodiments of the present invention with that of a quarter wave line.

FIG. 11 shows the simulated IM2 rejection for a 4×75 μm ALGaN/GaN HEMT comparing the exemplary embodiment shown in FIGS. 9 and 10, Lumped-R depicting the FIG. 9 circuit results and distributed-R depicting the FIG. 11 circuit results. The simulated results using a conventional short circuited quarter wave (λ/4 at 9.5 GHz) transmission line are again included for comparison. These numerical simulations were performed, as previously shown, using the harmonic balance simulator in Agilent ADS. The improved performance using embodiments of the harmonic termination circuit with the resistive termination is 40% more bandwidth than quarter wave (λ/4) filter for an improvement in IM2 rejection of at least 10 dB.

Figure 12:
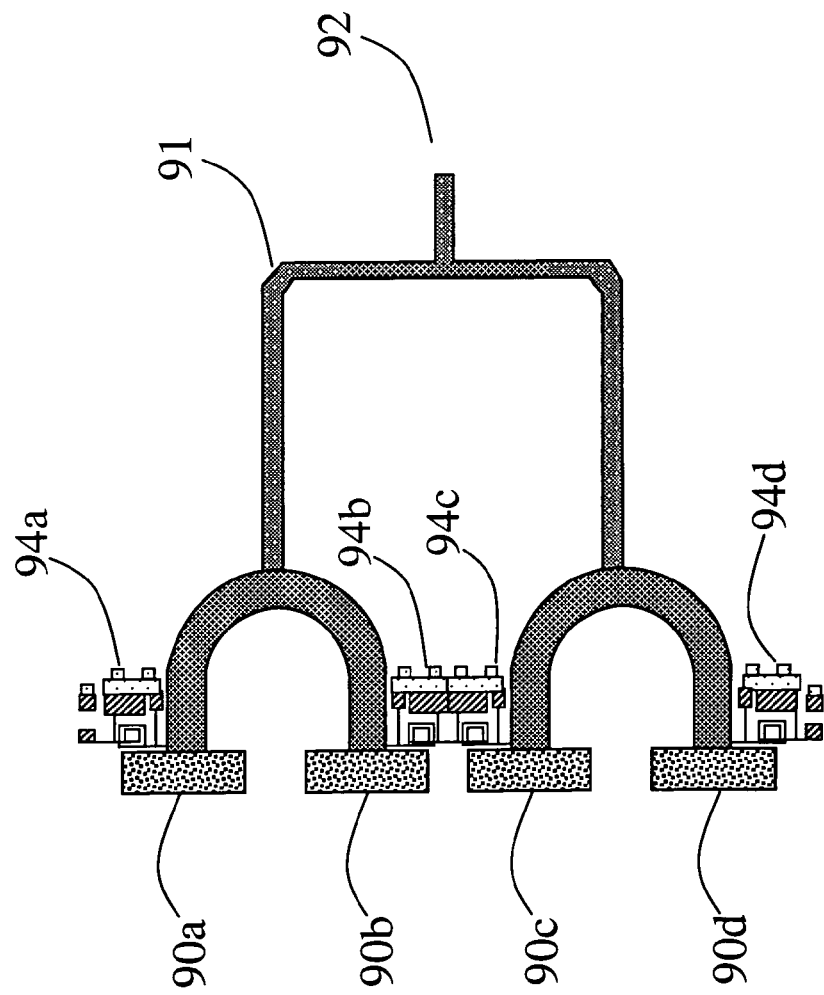
FIG. 12 shows yet another exemplary embodiment of a power combiner network implementing harmonic termination circuits in accordance with the present invention.

FIG. 12 shows a further exemplary embodiment of harmonic termination circuits in combination with a power amplifier output combiner. Four large 10×125 μm GaN HEMTs 90a, 90b, 90c, 90d supply RF power to be provided to output 92 through feed network 91. Harmonic termination circuits 94a, 94b, 94c, 94d, such as those described above in conjunction with FIGS. 7 and 8, are coupled to the respective HEMT transistor drains as described above.

Those skilled in the art can also appreciate that the principles set forth above can, in addition to dealing with $2f_o$ harmonic termination, could also be adapted to apply to $3f_o$ or higher harmonic frequency termination.

Therefore, while bias networks have been traditionally used only for supplying DC power to amplifier stages, in accordance with the present invention the use of the bias networks as harmonic terminations can:

(1) increase power added efficiency for power amplifiers, particularly where medium bandwidth (up to 40%) is sought;

(2) increase $2^{nd}$ order intermodulation (IM2) linearity in power amplifiers and low noise amplifiers where medium bandwidth is sought;

(3) increase IM2 rejection and power added efficiency for power amplifiers requiring high output power levels e.g., power amplifiers using a corporate feed structure; and (4) because the harmonic filter network is incorporated into the biasing scheme and is relatively compact, it does not interfere with the signal flow used in the popular corporate feed distribution topology.

The invention claimed is:

1. A method of broadband termination of amplifier harmonics from an active device, comprising:
   configuring a pi network providing a low impedance at frequency bands above a frequency band of operation while allowing DC bias to be appliable to the active device output,
   wherein configuring the pi network includes:
      coupling a low pass filter to an active device drain, the low pass filter having an RF choke and a first capacitor; and
      coupling a series inductor capacitor resistor resonant circuit in parallel with the low pass filter, the series inductor capacitor resistor resonant circuit having:
         a resistor valued to provide a load to at least a second harmonic frequency of a desired frequency;
         a second capacitor being valued to resonate with the RF choke to produce a high impedance at the desired frequency and a low impedance at at least a second harmonic of the desired frequency; and
         an inductor being valued to resonate with the second capacitor at at least the second harmonic frequency of the desired frequency; and
   coupling the pi network to the active device output.

2. A broadband harmonic termination apparatus for an active device output comprising:
   a pi network coupleable to the active device output and providing a low impedance at frequency bands above a frequency band of operation while allowing DC bias to be applied to the active device output,
   wherein the pi network includes:
      a low pass filter coupled to an active device drain, the low pass filter having an RF choke and a first capacitor; and
      a series inductor capacitor resistor resonant circuit coupled in parallel with the low pass filter, the series inductor capacitor resistor resonant circuit having:
         a resistor valued to provide a load to at least a second harmonic frequency of a desired frequency;
         a second capacitor being valued to resonate with the RF choke to produce a high impedance at the desired frequency and a low impedance at at least a second harmonic of the desired frequency; and
         an inductor being valued to resonate with the second capacitor at at least the second harmonic frequency of the desired frequency.

3. A method of power combining having broadband termination of amplifier harmonics, comprising:
   providing a power combining network having a plurality of input ports and a power combined output port;
   coupling respective amplifiers to the input ports, each amplifier having an active device output;
   configuring a pi network providing a low impedance at frequency bands above a frequency band of operation while allowing DC bias to be appliable to the active device output and coupling respective pi network to each active device output,
   wherein configuring the pi network includes:
      coupling a low pass filter to an active device drain, the low pass filter having an RF choke and a first capacitor; and
      coupling a series inductor capacitor resistor resonant circuit in parallel with the low pass filter, the series inductor capacitor resistor resonant circuit having:
         a resistor valued to provide a load to at least a second harmonic frequency of a desired frequency;
         a second capacitor being valued to resonate with the RF choke to produce a high impedance at the desired frequency and a low impedance at at least a second harmonic of the desired frequency; and
         an inductor being valued to resonate with the second capacitor at at least the second harmonic frequency of the desired frequency.

4. A power combiner having broadband termination of amplifier harmonics, comprising:
   a power combining network having a plurality of input ports and a power combined output port;
   respective amplifiers coupled to the input ports, each amplifier having an active device output; and
   a pi network configured to provide a low impedance at frequency bands above a frequency band of operation while allowing DC bias to be appliable to the active device output, wherein a respective pi network is coupled to each active device output,
   wherein the pi network includes:
      a low pass filter to an active device drain, the low pass filter having an RF choke and a first capacitor; and
      a series inductor capacitor resistor resonant circuit coupled in parallel with the low pass filter, the series inductor capacitor resistor resonant circuit having:
         a resistor valued to provide a load to at least a second harmonic frequency of a desired frequency;
         a second capacitor being valued to resonate with the RF choke to produce a high impedance at the desired frequency and a low impedance at at least a second harmonic of the desired frequency; and
         an inductor being valued to resonate with the second capacitor at at least the second harmonic frequency of the desired frequency.

* * * * *